US007557431B2

(12) United States Patent  
Shaikh

(10) Patent No.: US 7,557,431 B2  
(45) Date of Patent: Jul. 7, 2009

(54) MICROWAVE SURFACE MOUNT HERMETICALLY SEALED PACKAGE AND METHOD OF FORMING THE SAME

(75) Inventor: Naseer A. Shaikh, St. James, NY (US)

(73) Assignee: MITEQ, Inc., Hauppauge, NY (US)

( * ) Notice: Subject to any disclaimer, the term of this patent is extended or adjusted under 35 U.S.C. 154(b) by 16 days.

(21) Appl. No.: 12/016,730

(22) Filed: Jan. 18, 2008

(65) Prior Publication Data

US 2008/0180924 A1 Jul. 31, 2008

Related U.S. Application Data

(60) Provisional application No. 60/881,062, filed on Jan. 18, 2007.

(51) Int. Cl.
  *H01L 23/552* (2006.01)
(52) U.S. Cl. .................... 257/659; 333/246
(58) Field of Classification Search ............... 257/659, 257/660, 708–711; 438/121; 333/246, 247; 439/579; 361/767; 174/50.52, 50.54, 51, 174/534
See application file for complete search history.

(56) References Cited

U.S. PATENT DOCUMENTS

| 4,280,112 | A | * | 7/1981 | Eisenhart | 333/21 R |
|---|---|---|---|---|---|
| 5,853,295 | A | * | 12/1998 | Rosenberger | 439/63 |
| 5,936,492 | A | * | 8/1999 | Shingyoji et al. | 333/246 |
| 6,018,283 | A | * | 1/2000 | Kyhl et al. | 333/247 |
| 6,215,377 | B1 | * | 4/2001 | Douriet | 333/247 |
| 6,661,318 | B2 | * | 12/2003 | Tamaki et al. | 333/260 |
| 6,737,931 | B2 | * | 5/2004 | Amparan et al. | 333/34 |
| 6,980,068 | B2 | * | 12/2005 | Miyazawa et al. | 333/260 |
| 6,987,429 | B2 | * | 1/2006 | Shih et al. | 333/26 |
| 2002/0075105 | A1 | * | 6/2002 | Douriet et al. | 333/247 |
| 2002/0180062 | A1 | * | 12/2002 | Hsieh et al. | 257/778 |
| 2002/0186105 | A1 | * | 12/2002 | Shih et al. | 333/208 |
| 2003/0111714 | A1 | * | 6/2003 | Bates et al. | 257/678 |

\* cited by examiner

*Primary Examiner*—Phuong K Dinh  
(74) *Attorney, Agent, or Firm*—Lackenbach Siegel, LLP; Myron Greenspan

(57) ABSTRACT

A broadband surface mounting package includes a housing having a flat bottom wall forming parallel first and second surfaces. An integral wall forms, with the bottom wall, an enclosure having a top opening to provide access to an interior compartment or cavity to receive a microwave component. The second surface is arranged to contact a printed circuit board (PCB) for attachment to lands or pads on the PCB. Cylindrical holes in the enclosure each defines an axis parallel to the bottom wall, and has a dimension, generally transverse to the bottom wall, to extend from the second surface to at least the first surface, and has an axial length sufficient to provide a through hole in the wall and a gap within the bottom wall proximate to and inwardly from the wall. A J-shaped conductive element in the form of a pin is hermetically sealed within the hole and each generally extends along a direction parallel to the axis and has a contact surface coextensive with the second surface, and a connection surface exposed within the cavity to which an electrical connection can be made. A cover selectively closes and hermetically seals the top opening after the microwave component(s) has been secured within the compartment and internal connections have been made. The J-shaped conductive elements are configured to promote impedance matching and to reduce microwave signal losses when said enclosure is surface mounted on a PCB. A method of making the package is disclosed.

20 Claims, 13 Drawing Sheets

MICROWAVE SURFACE MOUNT HERMETICALLY SEALED PACKAGE AND METHOD OF FORMING THE SAME

CROSS-REFERENCE TO RELATED APPLICATION

This application is related to Provisional Application Ser. No. 60/881,062 filed on Jan. 18, 2007.

BACKGROUND OF THE INVENTION

1. Field of the Invention

The present invention generally relates to packages for microwave circuits, and, more specifically, to a surface mount hermetically sealed package useful of the range of 0.1-50 GHz.

2. Description of the Prior Art

In the growing market of personal and satellite communications there is a need for a low cost, wideband, surface mount package (SMT) that can be used in a host of different environments. To provide maximum versatility or flexibility, such packages needs to be user friendly, and reliable and secure and protect microwave monolithic integrated circuits (MMIC) and other devices. Because such circuits can be used in satellites, be exposed to varied climatic conditions as well as possibly corrosive and polluting contaminants in the environment, such packages should also preferably be hermetically sealed to protect the integrated circuits housed within the package. Also, since applications have been identified for use of the microwave range of up to 50 GHz and beyond a package of this type must be suitable for use over broadband ranging from DC upwards of 50 GHz. In the past, IC devices have been packaged using complex, high cost packages, designed for low volume assembly and frequently without the requisite high reliability.

While some existing packages are suitable for surface mounting, these typically employ expensive materials and use glass-to-metal seals, multi-layer ceramic structures, machined metallic cases of substrates, expensive alloys and relatively thick gold plating. Some of these packages use the following technologies: stripline, microstrip, coaxial, and coplanar waveguide transmission line structures. However, some of these conventional packages introduce discontinuities in the electromagnetic field distributions and RF current configurations. These discontinuities need to be compensated for in prior art packages to eliminate signal reflections and losses that would otherwise be damaging to the performance of the package.

One of the difficulties with surface mount (SMT) packages at the higher microwave frequency ranges is that the packages inevitably have a bottom wall, which makes contact with the printed circuit board (PCB), and such bottom wall has a predetermined thickness. Therefore, there must be a "stepped" transition to bring the signal to the circuitry within the case or package at a higher physical plane above the bottom surface of the case or package that makes physical contact with the conductive pads or lands on the PCB. This presents an impedance matching issue which, as the frequency increases, can become more significant and problematic.

In an article entitled "50 GHz Broadband SMT Package for Microwave Applications", Yoshida et al., "2001 Electronic Components and Technology Conference" a discussion is presented of several SMT packages. However, the authors recognize that at frequencies over 30 GHz the return loss in an SMT package is frequently degraded, and that such a package that achieves transmissions of up to 50 GHz and above with low loss has still not been reached or achieved. Such a "step up" or displacement in physical planes required by SMT packages is frequently achieved by the use of holes or VIA through a PCB or package, that are typically drilled with tiny drill bits and filled with pins or rivets. However, when very small VIA's are required, drilling with mechanical bits is costly because of high rates of wear and breakage. In this case, VIAs may be evaporated by lasers. Laser-drilled VIAs typically have an inferior surface finish inside the hole and these holes are called micro-VIAs. The quality of the VIAs, in some instances, limits the quality of the hermetic seal that can be achieved for the package.

U.S. Pat. No. 5,853,295 to Rosenberger discloses a coaxial line cut away at an angle for attachment to a substrate and a planar to coaxial connection, where the coaxial line is cut away at about a 60 degree angle so that the flat section meets a microstrip line at about 30 degrees.

Other references that suggest a step up include U.S. Pat. No. 6,987,429 and U.S. Published Patent Application No. 2002/0186105, both to Shih et al., which are for a waveguide to microstrip connection. This patent and patent application disclose an interconnection between a waveguide and a microstrip, comprised of a "J"-shaped plate. The plate has a bifurcated end to the base of the J, where it is attached to a probe extending from the waveguide. The J is more like an L with a corner cut off. However, the J does not vary in width along is height transition, and the connection is not from coaxial to circuitry. These are clearly "J" strips, but they are not shown as coaxial to circuitry connection. The input has a bifurcated connection to a rod extending from the waveguide. Possibly this could be the inner wire of a coaxial line.

U.S. Pat. No. 6,018,283 to Kyhl et al. discloses a Z-axis interconnector of overlapping striplines with tuning stubs, which discloses a two-axis interconnect, i.e., Z axis, used in MMIC, comprised of multi-layer stripline segments, overlapping, with tuning stubs. The frequency range is DC to 100 Ghz. U.S. Pat. No. 4,280,112 (Eisenhart) discloses a coaxial to stripline connection, with the center lead in the coax tilted downward and the bottom third of the coaxial section cut away. U.S. Pat. No. 5,936,492 (Shingyoji et al.) discloses a MMIC interconnection in the form of an upward sloping stripline over a dielectric (for impedance matching). The frequency range is DC to 100 GHz. U.S. Patent/Publication Nos. 6,215,377, 6,426,686 and 2002/0075105 (all by Douriet et al.) all disclose microstrip interconnections with step-up sections. The '377 patent uses VIA's for the step-up. The '686 patent and the '105 patent application use strips for the step-up. U.S. Patent/Publication Nos. 6,661,318 and 2003/0206084 (by Tamaki et al.) disclose coaxial lines used as interconnections for different height circuitry. The center lead id soldered to a lower plane surface, the shield is soldered to higher plane surface, and the line is fed to a still higher level. U.S. Pat. No. 6,737,931 (Amparan et al.) discloses a sloped and tapered strip transmission line for interconnections at different heights. U.S. Pat. No. 6,980,068 (Miyazawa et al.) discloses a coaxial to stripline transition where the center conductor is attached to the central plane of a three layer sandwich and the outer layers are attached to the outer coaxial shield. U.S. Pat. No. 6,992,544 (Barnes et al.) discloses a coaxial SMT connection, with the coaxial line at right angles to the SMT plane. U.S. Publication No. 2004/0051173 (Koh et al.) discloses a coaxial cable to a shelf mounted microstrip. U.S. Publication No. 2005/0285234 (Kanno) discloses an interconnection comprised of a series of striplines and VIA's, impedance 50 ohms, frequency range up to 45 GHz.

SUMMARY OF THE INVENTION

Accordingly, it is an object of the present invention to provide a microwave surface mount package that does not have the disadvantages inherent in prior art packages.

It is another object of the invention to provide a surface mount package that is inexpensive to manufacture and economical.

It is still another object of the invention to provide a surface mount package that is reliably and hermetically sealed.

It is yet another object of the invention to provide a microwave package of the type under discussion which can be surface mounted on a printed circuit board (PCB) while maintaining impedance match and minimizing return and insertion losses.

It is a further object of the invention to provide a microwave SMT package of the type under discussion which is usable in the frequency range up to beyond 50 GHz.

It is still a further object of the invention to maintain a substantially gain flatness in the range of approximately +/−2.5 dB.

It is yet a further object of the invention to provide a surface mount microwave package that can be used with various band widths.

It is yet a further object of the invention to provide an SMT microwave package that can be used in numerous environments.

It is an additional object of the invention to provide a SMT microwave package that provides low transmission losses from DC to Broadband.

In order to achieve the above and other objects it will become apparent hereinafter, the SMT package is machined from a block of suitable material, such as Kovar, to provide a package with a bottom wall and side walls and an opening at the top. Holes or bores are drilled in the side walls at location where RF inputs and outputs and DC power are to be provided. A center conductor or pin is axially mounted within the bores of the drilled holes and these are encapsulated with in a glass substrate which are heated to provide a hermetic seal between the center conductors and the interior surfaces of the bores of the drilled holes. The bottom half of the case is machined away to expose a portion of the center conductor on the bottom surface of the remaining package, leaving a smooth surface of the center conductor, flush with the bottom surface of the package. The center conductor section is enabled to be surface mounted on a PCB. The conductor is configured in the shape of a "J" so that the opposing ends of the conductor are situated in two spaced vertical planes—one being in the plane of the lower surface of the package suitable for a contact with a PCB land or conductive pad and the other end is exposed on the interior of the package when the interior is machined to provide a receiving compartment, for receiving, for example, a microwave monolithic integrated circuit (MMIC). By positioning opposing ends of the conductor in two spaced vertical planes, the conductor can be connected to both the PCB, by surface mounting the package, and to the internal integrated circuits. After the MMIC has been mounted within the package and leads connected to the center conductors extending through each of the bores of the drilled holes, which have now been hermetically sealed, the top of the package is then closed with a suitable cover and hermetically sealed as well to provide a reliable hermetically sealed package.

More generally, the broader aspects of the invention contemplate a broadband surface mounting package and method of forming the same as defined below.

A broadband surface mounting (SMT) package, comprises:

a housing having a substantially flat bottom wall defining a predetermined perimeter and forming substantially parallel first and second surfaces, and wall means substantially normal to said bottom wall and extending from said bottom wall about said predetermined perimeter to form an enclosure having an top opening opposite said bottom wall to provide access to an interior compartment dimensioned to receive at least one microwave component, said second surface being arranged to physically and electrically contact a printed circuit board (PCB) for selective attachment to at least one conductive land or pad on the PCB, at least one cylindrical hole in said enclosure that defines an axis substantially parallel to said bottom wall and extends in a direction generally transverse to said bottom wall from said second surface to at least said first surface, and has an axial length generally parallel to said bottom wall sufficient to provide a through hole in said wall means and a gap within said bottom wall proximate to and inwardly from said wall means;

a J-shaped conductive element having a first portion within said at least one cylindrical hole and extending along a direction parallel to said axis and having a contact surface substantially coextensive with said second surface, and a second portion that projects at least to said first surface and having a connection surface to which an electrical connection can be made within said compartment, sealing means for hermetically sealing the space between a cylindrical wall forming said at least one cylindrical hole and an associated J-shaped conductive element received therein;

power conductor means for hermetically introducing power into said compartment and to electrical component(s) placed therein;

connecting means for connecting said power conductor means to internal microwave component(s) and for connecting a microwave signal interface on microwave component(s) to said connecting surface of said J-shaped conductive element; and a cover for selectively closing and hermetically sealing said top opening of said enclosure after the microwave component(s) has been secured within said compartment and connections by said connecting means have been made, said J-shaped conductive element being configured to promote impedance matching and to reduce microwave signal losses when said enclosure is surface mounted on a PCB to result in electrical contact between a conductive land or pad on the PCB and said connection surface on said J-shaped conductive element and microwave signals are introduced to the internally-mounted microwave component(s) through said at least one hermetically sealed hole in said enclosure.

A method of forming a broadband surface mounting package, comprising the steps of:

forming a block of material defining a predetermined plane cutting through said block;

forming at least one cylindrical hole within said block that defines an axis generally parallel to said predetermined plane and has a predetermined axial length;

positioning a J-shaped conductive element within said at least one cylindrical hole and generally extending along a direction parallel to said axis and having a first portion having a contact surface below said predetermined plane and a second portion that projects at least to said predetermined plane and having a connection surface to which an electrical connection can be made;

hermetically sealing the space between a cylindrical wall forming said at least one cylindrical hole and an associated J-shaped conductive element received therein to fix the position of said J-shaped conductive element within said at least one cylindrical hole while providing a hermetic seal;

machining an interior region of said block to one side of said predetermined plane to form a cavity or compartment surrounded by a peripheral wall having a thickness less than said predetermined axial length where said at least one cylindrical hole is formed and a first surface substantially coextensive with said predetermined plane to expose said connection surface of said J-shaped conductive element within said cavity or compartment and forming a top opening opposite said first surface to provide access to said cavity or compartment dimensioned to receive at least one microwave component;

machining said block to another side of said predetermined plane to form a second surface coextensive with said contact surface of said J-shaped conductive element, said first and second surfaces together forming a bottom wall of an enclosure, said second surface being substantially flat and suitable for placement on a printed circuit board (PCB) to provide physical and electrical contact of said contact surface with an electrical pad or land on the PCB;

establishing hermetic means for introducing power from the outside to the inside of the enclosure; and providing a cover for selectively closing and hermetically sealing said top opening of said enclosure after microwave component(s) has been secured within said compartment and connections by said connecting means have been made, said J-shaped conductive element being configured to promote impedance matching and to reduce microwave signal losses when said enclosure is surface mounted on a PCB to result in electrical contact between a conductive land or pad on the PCB and said connection surface on said J-shaped conductive element and microwave signals are introduced to the internally-mounted microwave component(s) through said at least one hermetically sealed hole in said enclosure.

With the Invention at least one microwave component can be placed within said cavity or compartment of said enclosure and a cover can be placed over the top opening to hermetically seal said enclosure after connecting power to internal microwave component(s) and connecting a microwave signal interface on microwave component(s) to said contact surface of said J-shaped conductive element and the enclosure surface mounted on a PCB.

DETAILED DESCRIPTION OF PREFERRED EMBODIMENT

Figure 1:
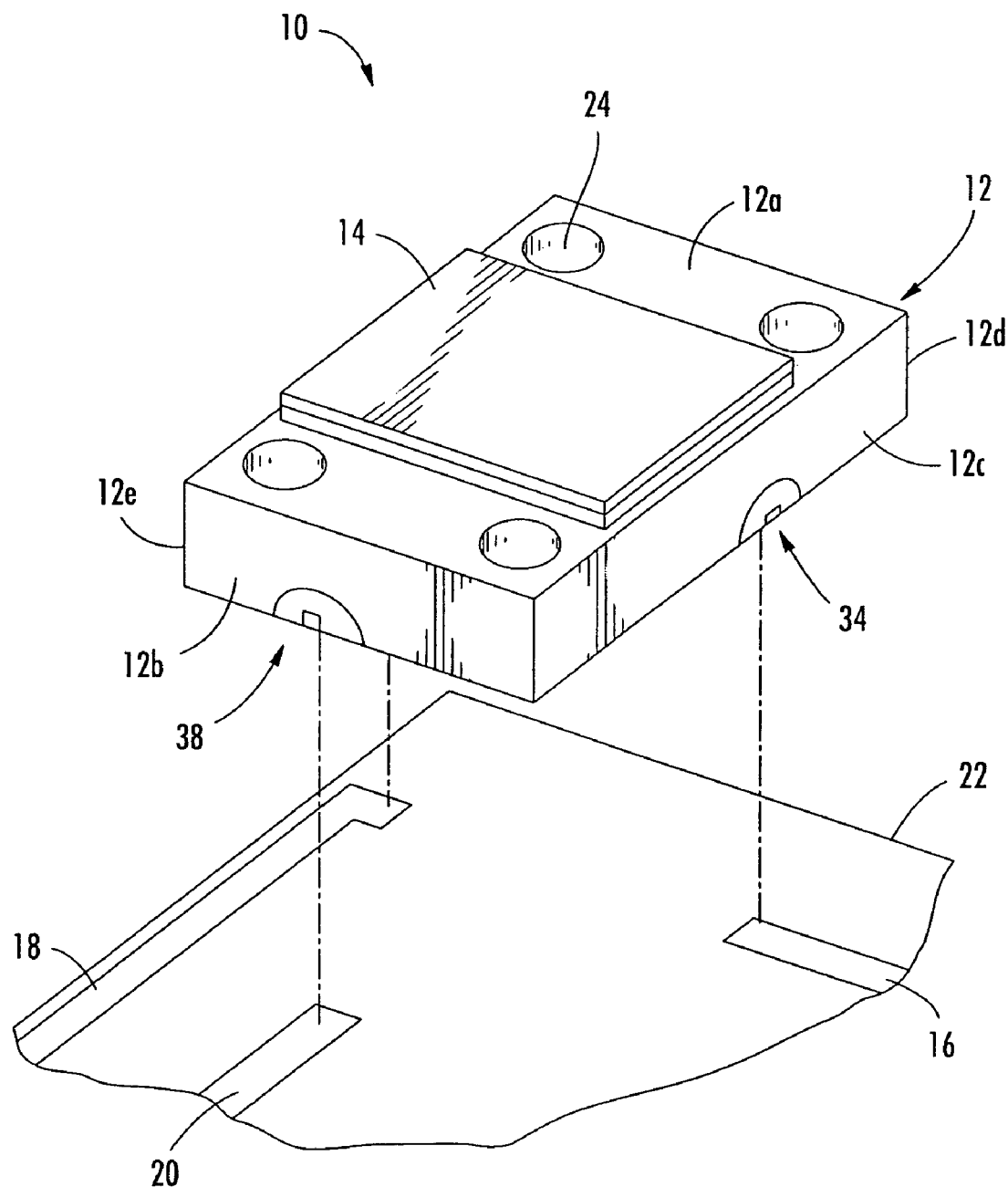
FIG. 1 is a perspective view of the microwave surface mount hermetically sealed package in accordance with the present invention, shown aligned and ready for positioning and attachment to the conductive land or pads on a printed circuit board.

Referring now specifically to the figures, in which the identical or similar parts will be designated by the same reference numerals throughout, and first referring to FIGS. 1-4, a microwave surface mount (SMT) hermetically sealed package in accordance with the present invention is generally designated by the reference numeral 10.

The package 10 includes an enclosure or housing 12 has a top wall 12a, side walls 12b-12e, a bottom wall 12f and an upper surface 12g of the bottom wall 12f. The housing or enclosure 12 is initially made with a top opening through which circuitry, such as one or more microwave monolithic integrated circuit(s) (MMIC) or other electronic device(s) may be inserted into the enclosure and subsequently closed by a cover 14 and hermetically sealed in accordance with well known techniques.

In the illustrated embodiment, the package 10 has an RF input, an RF output and a DC port, for example, as will be more fully described, that are arranged to contact a land or pad 16 for RF input, a land or pad 18 for RF output and a land or pad 20 for DC power provided on a printed circuit board (PCB) such that the package 10 may be surface mounted on the PCB 22 in accordance with conventional methods. The housing or enclosure 12 is shown to be provided with through holes or bores 24 for attachment to a test jig to test the package 10 prior to surface mounting on a PCB 22.

Referring to FIGS. 6-11, in which the interior of the housing or enclosure 12 is shown, prior to attachment of the cover 24, there is provided an RF chamber 26 in the form of an internal cavity, compartment, cell or recess and a comparable DC chamber 28, so that the RF circuitry is introduced into the RF chamber 26 and the DC power is introduced into the DC chamber 28. The chambers 26 may be provided with a partition wall 30 provided with an opening or break 32 in the partition wall for passage of a DC power conductor from the chamber 28 to the chamber 26, as suggested in FIG. 11.

Figure 4:
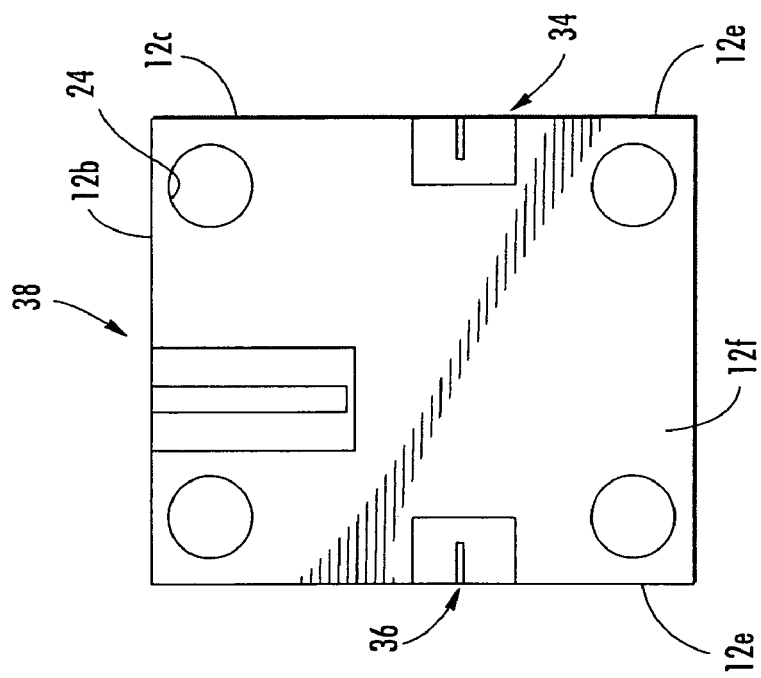
FIG. 4 is a bottom plan view of the package shown in FIG. 2, showing both the RF input and RF output connectors formed in the package in accordance with the invention as well as the power input connector similarly formed as the RF signal connectors.
Figure 5:
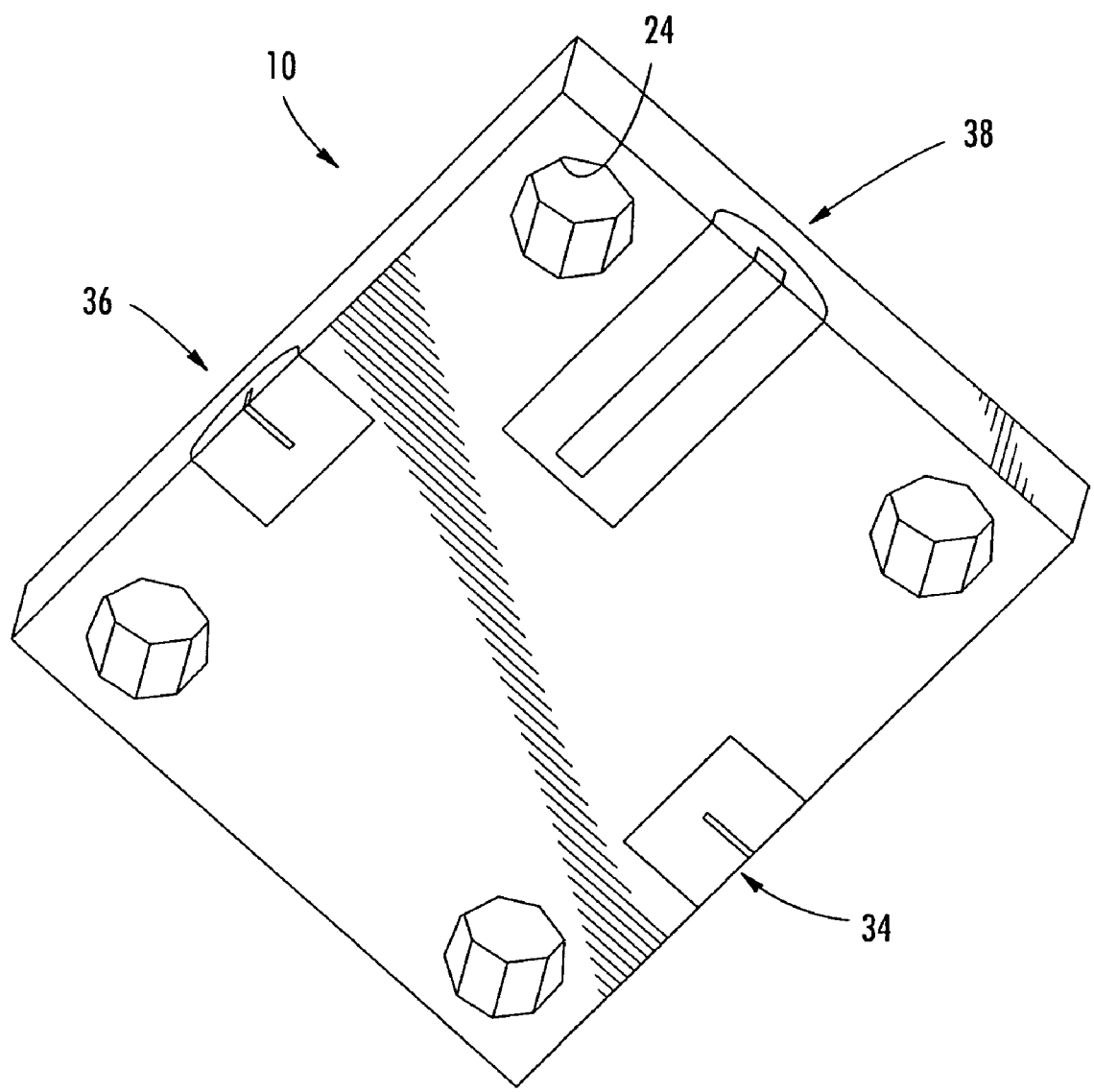
FIG. 5 is a perspective rendering of the package shown in FIG. 4, showing additional details of the RF and DC connectors suitable for surface mounting on a PCB.
Figure 6:
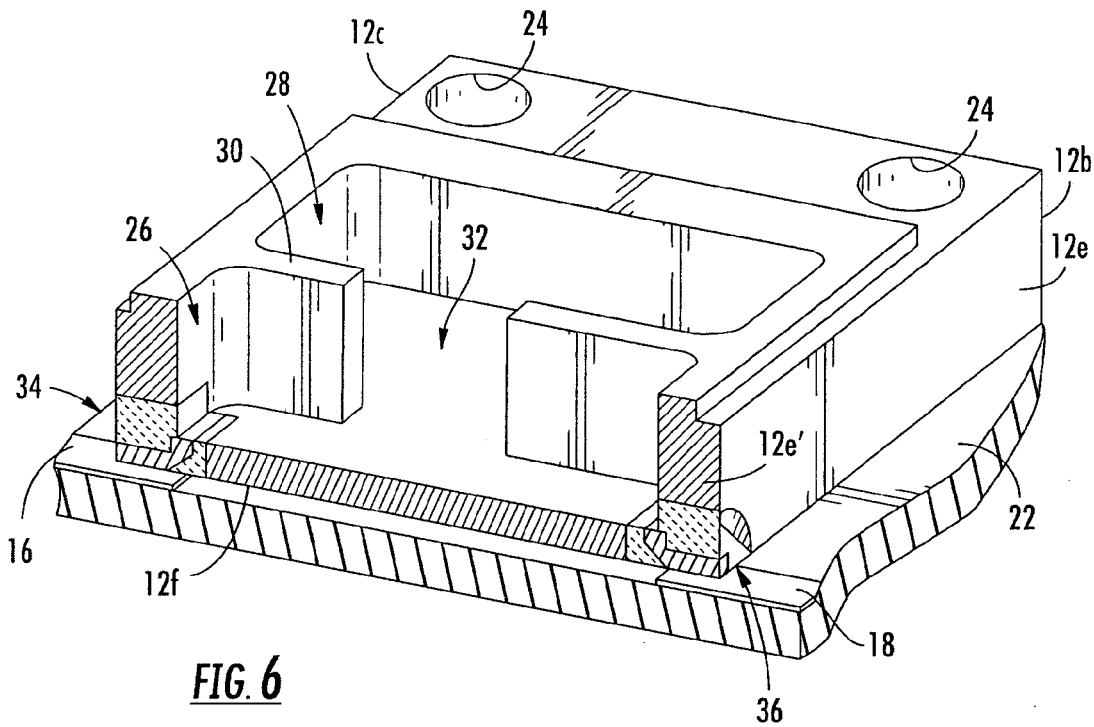
FIG. 6 is an enlarged cross-sectional view of the SMT package show in FIG. 1, with the coffer removed in the package sectioned through the RF input and output connectors to provide details of the center conductors that are hermetically sealed and provide the required "step up" from the plane of the conductive land or pads on the PCB and the lowest surface of the bottom wall accessible on the inside of the package for connection to electric circuitry.
Figure 7:
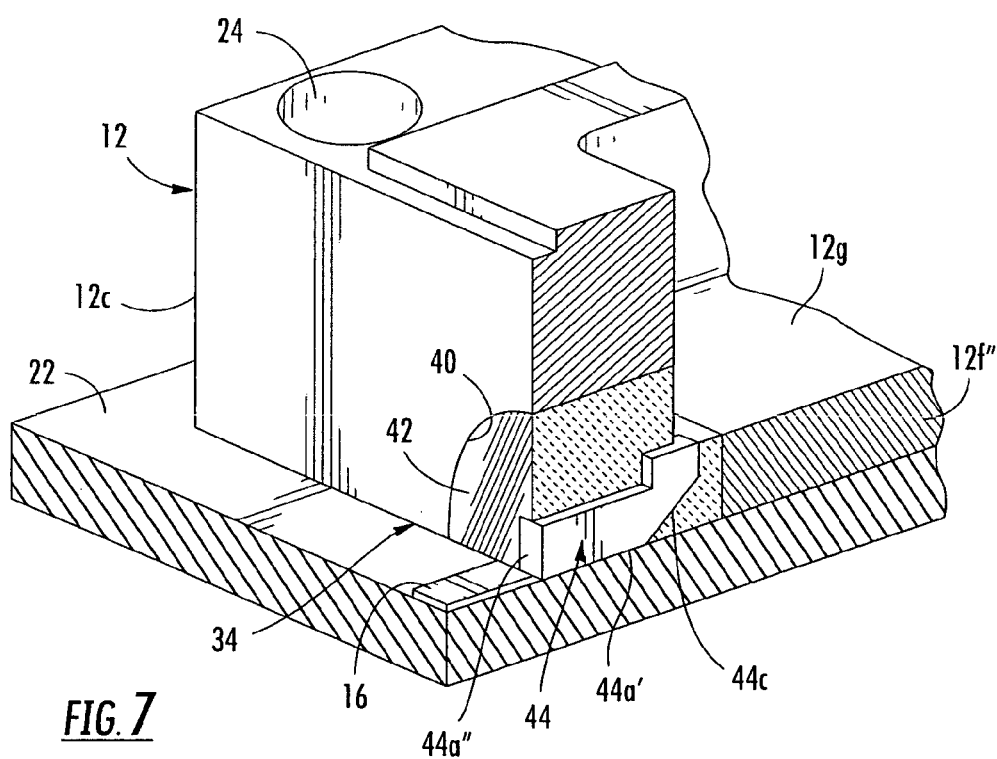
FIG. 7 is an enlarged section of one of the RF connectors shown in FIG. 6, showing additional details of the center pin.
Figure 8:
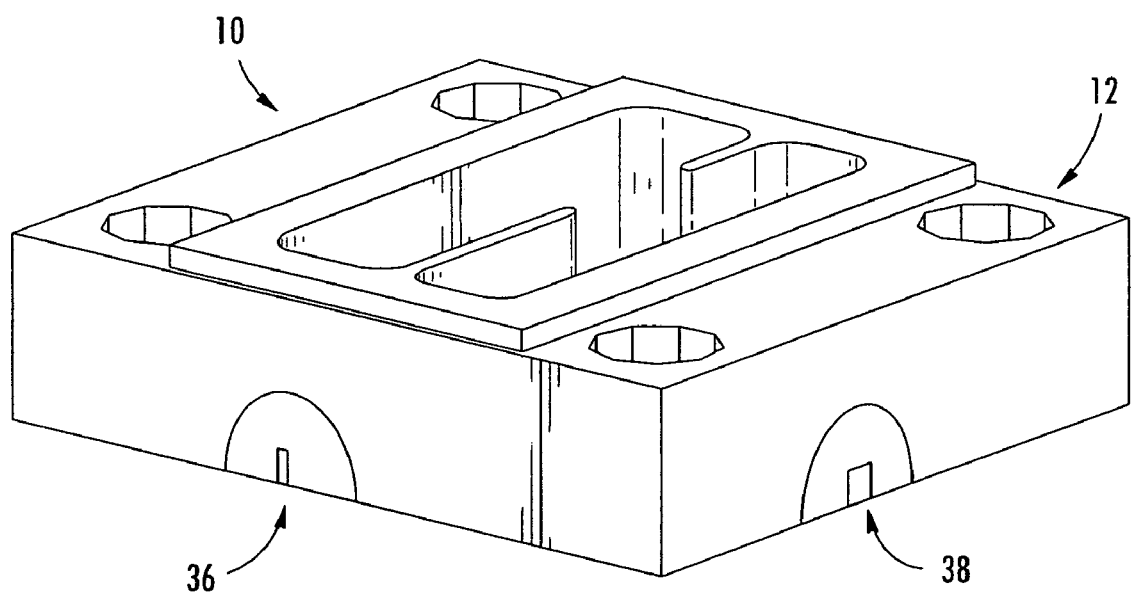
FIG. 8 is a perspective rendering of the package shown in FIG. 1, looking down in the package.
Figure 9:
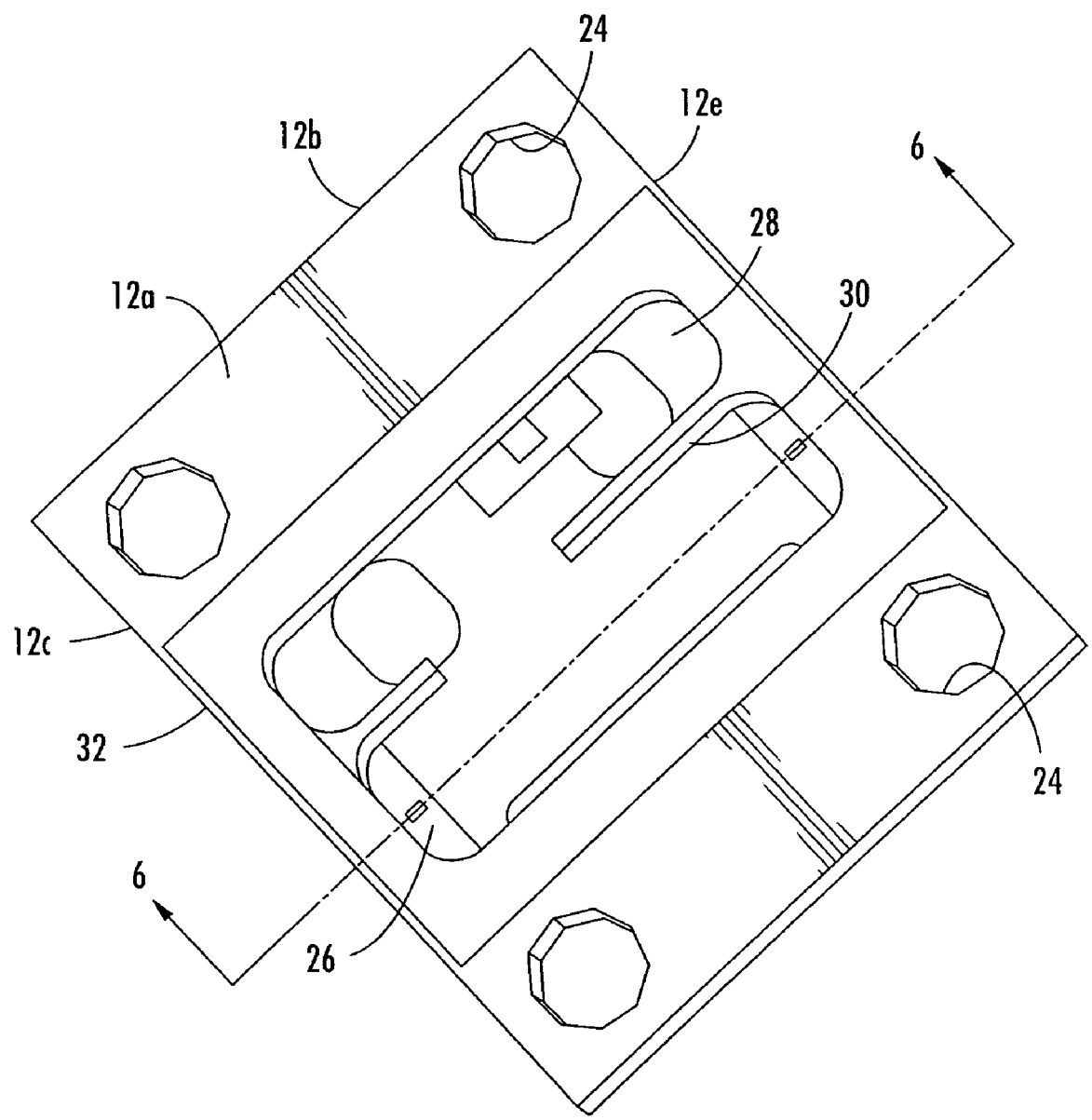
FIG. 9 is a rendering similar to FIG. 8, but is a plane view looking down on the package with the cover removed.
Figure 10:
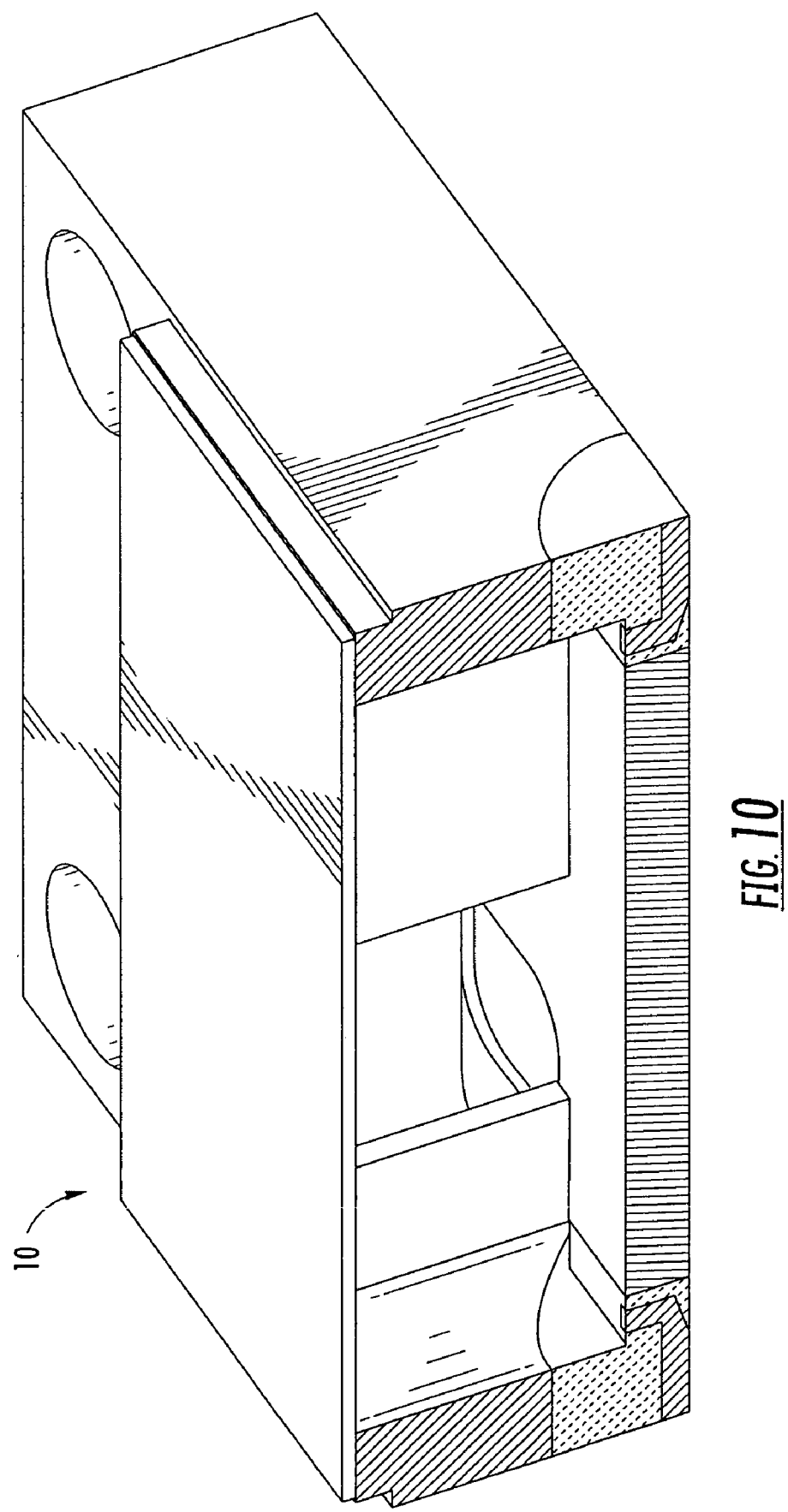
FIG. 10 is a rendering of the package similar to the view shown in FIG. 6.

Referring particularly to FIGS. 6 and 7, an RF input connector or termination is shown integrated into the side wall 12c and a similar RF output connector termination shown integrated in the opposing side wall 12e. Referring also to FIGS. 4 and 9, a DC connector termination is similarly integrated into side wall 12b, which is shown to be generally orthogonal to the side walls 12c and 12e. Although the internal connectors 34, 36 and 38 have been described as being formed in associated side walls, it will also be evident from FIGS. 4 and 5 that the connectors or terminations extend to and are also coextensive with the under surface or bottom surface of the bottom wall 12f so that they can make contact with the conductive lands or pads on a PCB for surface mounting thereon, as will become evident.

Referring in particular to FIG. 7, the details of one of these integrated connectors or terminations will be described in detail, it being understood that the same description applies to both RF input and RF output connectors 34, 36 and the DC connector 38. Each connector or termination includes a generally horizontal cylindrical hole or bore 40, only one quadrant of such hole being illustrated in FIG. 7, the facing quadrant having been removed to show the details of the internal construction of the connector. As will be more fully described in connection with FIG. 16, the cylindrical hole or bore is initially formed as a full cylinder, such as by drilling the material forming the enclosure or housing 12. However, the lower portion of the housing or enclosure 12 is removed by machining to remove the lower semi-cylindrical half of each of the cylindrical holes or bores 40, as shown, for example, in FIGS. 3, 8 and 11. By machining the lower portion of the enclosure or housing this makes it possible to surface mount the package 10 on a PCB as will become evident from the discussion that follows.

Each cylindrical hole or bore 40 is filled with a glass 42 which centers and maintains the position of a center conductor, in the form of a strip. In FIG. 7, a portion of the cylindrical hole, portion of the glass 42 and a portion of the conductor strip 44 become exposed on the under surface 12f so that contact may be made with the conductive lands 16, 18 and 20 on the PCB board.

An important feature of the invention is the shape or configuration of the conductor or center pin 44 to minimize input reflection coefficient and maximize forward transmission coefficient to thereby increase gain and minimize return losses at higher microwave frequencies. In the presently preferred embodiment, the center conductor is in the form of a "J" or "L" member or strip which includes a generally horizontal portion 44a, as viewed in FIG. 7, and a generally vertical portion 44b which rises above the dimensions of the horizontal portion 44a as shown in FIG. 7. An inclined or angled edge 44c is provided as shown to optimize impedance matching and minimizing reflection losses. The specific angle or position of the edge 44c can be determined empirically for any given set of parameters of the conductor strip 44 as well as the cylindrical hole 40. An important feature of the invention, however, is that once the enclosure 12 has been suitably machined, to provide the RF and DC chambers 26, 28 as well as the lower surface 12f, the lower edge 44a' is available for contact with the conductive land 16, while an upper surface 44b' is accessible within the respective chambers 26, 28 for interconnection with a suitable RF integrated circuit in the form of any applicable MMIC.

Figure 11:
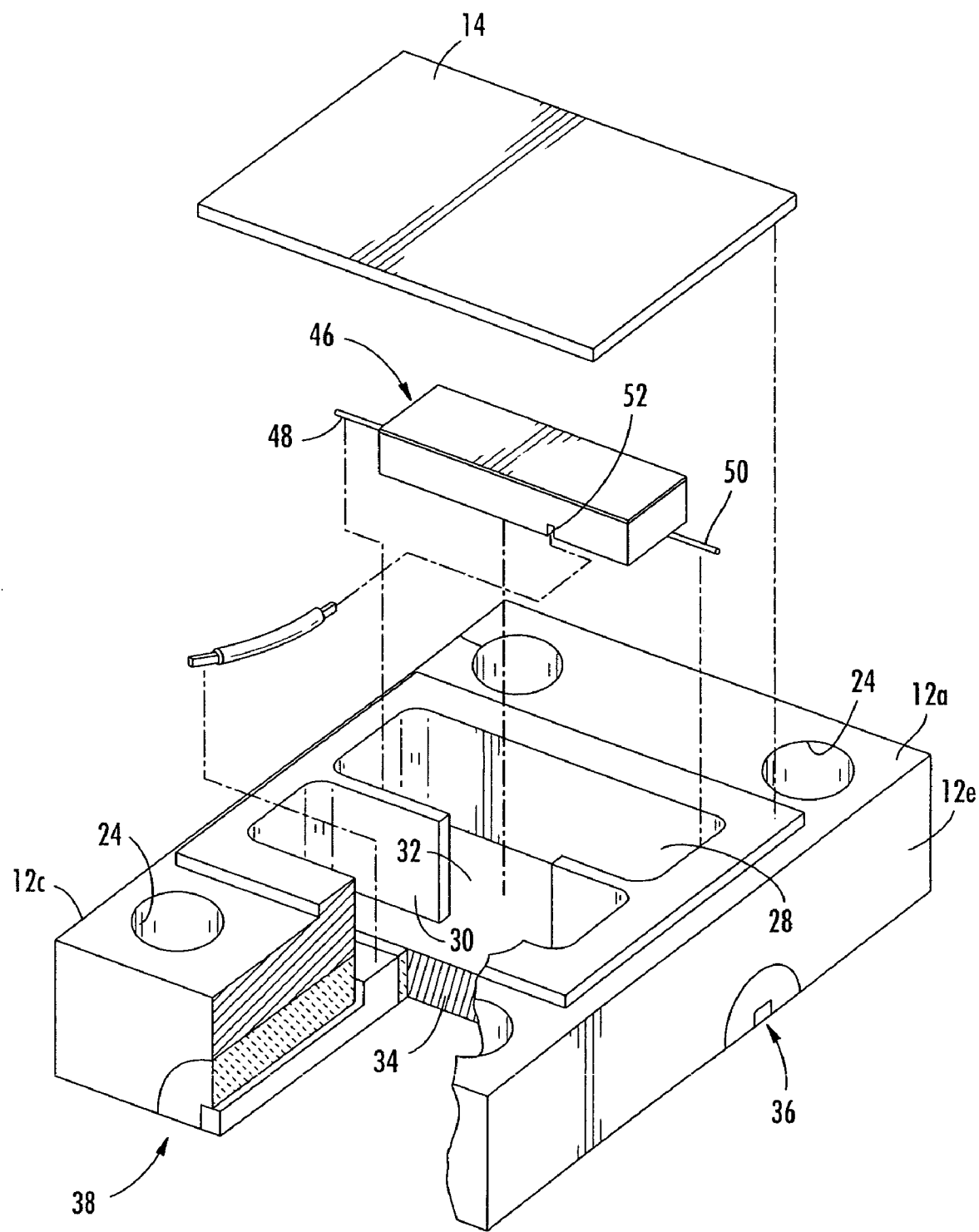
FIG. 11 illustrates the gain and return loss of one SMT package in accordance with the invention with 50 home lines in the test fixture.

Referring to FIG. 11, an RF circuit is designated by the reference numeral 46. The microwave circuit 46 may be any suitable circuit or circuits such as a local oscillator (LO), an LO buffer amplifier MMIC, a mixer, etc. these circuits may comprise discreet components, ICS, MICs or MMICs. The circuit 46 includes an RF input lead, an RF output lead 50 which may be suitably connected to the upper surfaces 44b' of associated center conductor strips 44, while a DC input tab 52 may similarly be connected to the upper edge or surface 44b' of the integrated DC connector or termination 38, as suggested in FIG. 11. Once the leads/tabs 48, 50 and 52 have been mechanically and electrically connected to their associated integrated connectors, the cover 24 may be attached to the upper surface of the enclosure or housing 12 to seal the chambers 26, 28. This may be done in any conventional way and may be attached after creating a vacuum within the respective chambers and/or filling these chambers with an inert gas or material.

Figure 12:
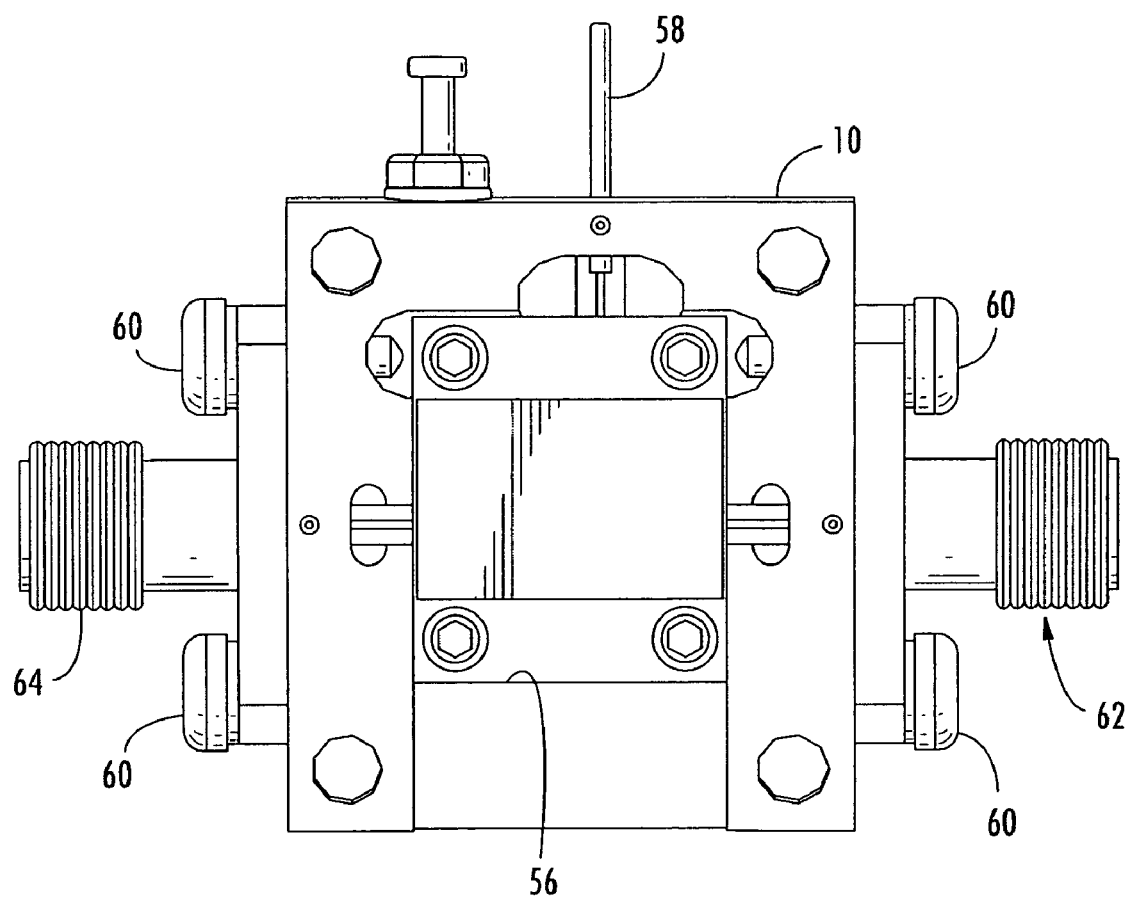
FIG. 12 is similar to FIG. 11 with a blank 4830 MMIC with the test fixture.
Figure 13:
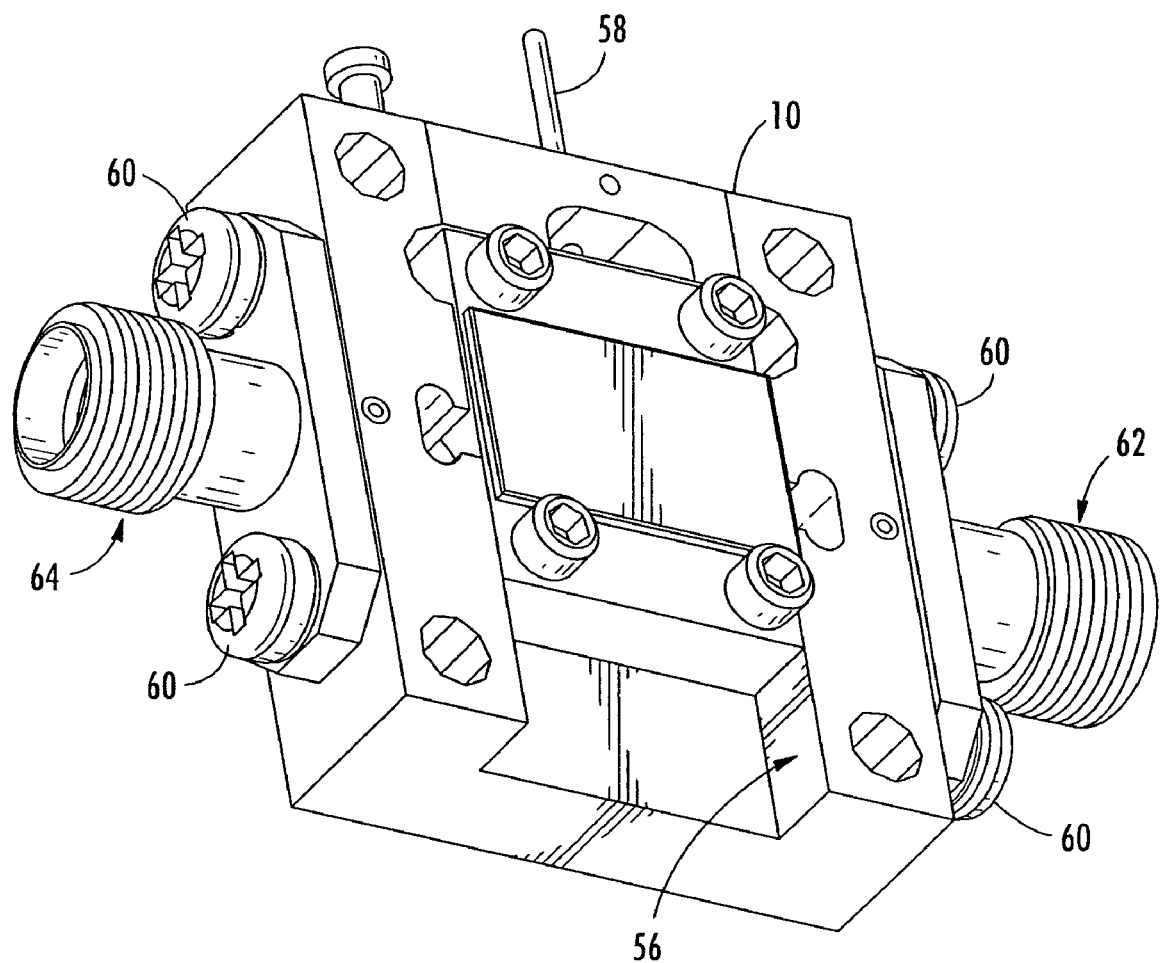
FIG. 13 is similar to FIG. 12, but as viewed in perspective.

Referring to FIGS. 12 and 13, a test jig 54 is shown configured and dimensioned to receive the SMT package 10 within a cavity 56 which allows power to be fed to the package by means of a power lead 58. As suggested, the SMT package 10 may be secured within the test jig 54 by means of screws 60, the input and output RF integrated connectors or terminations 34, 36 being coupled in the test jig to output and input coaxial connectors 62, 64. In this way, the SMT package can be tested for mechanical and electrical properties prior to insertion into a piece of application or test equipment.

Figure 3:
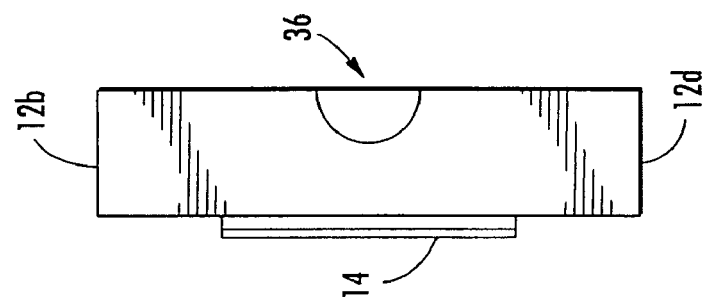
FIG. 3 is a side elevational view showing one side of the package shown in FIG. 2, illustrating the RF coaxial connector formed in the package suitable for attachment to a PCB.
Figure 2:
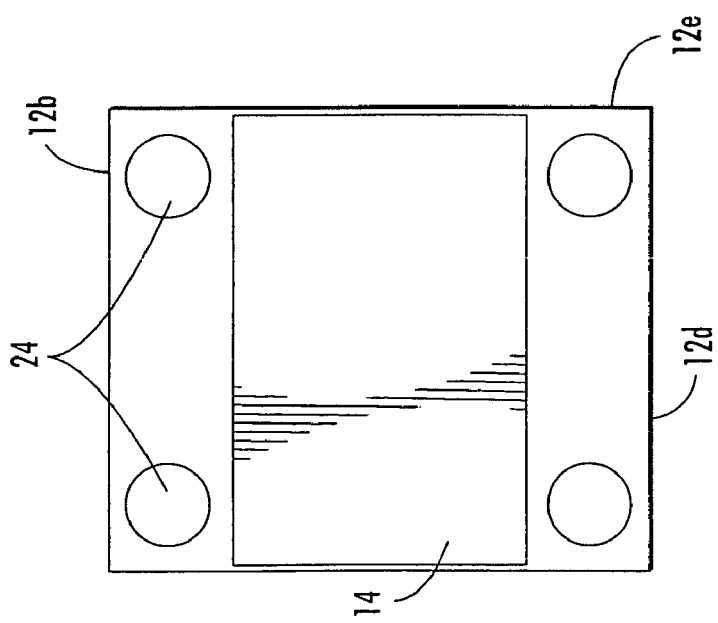
FIG. 2 is a top plan view of the package shown in FIG. 1.
Figure 16:
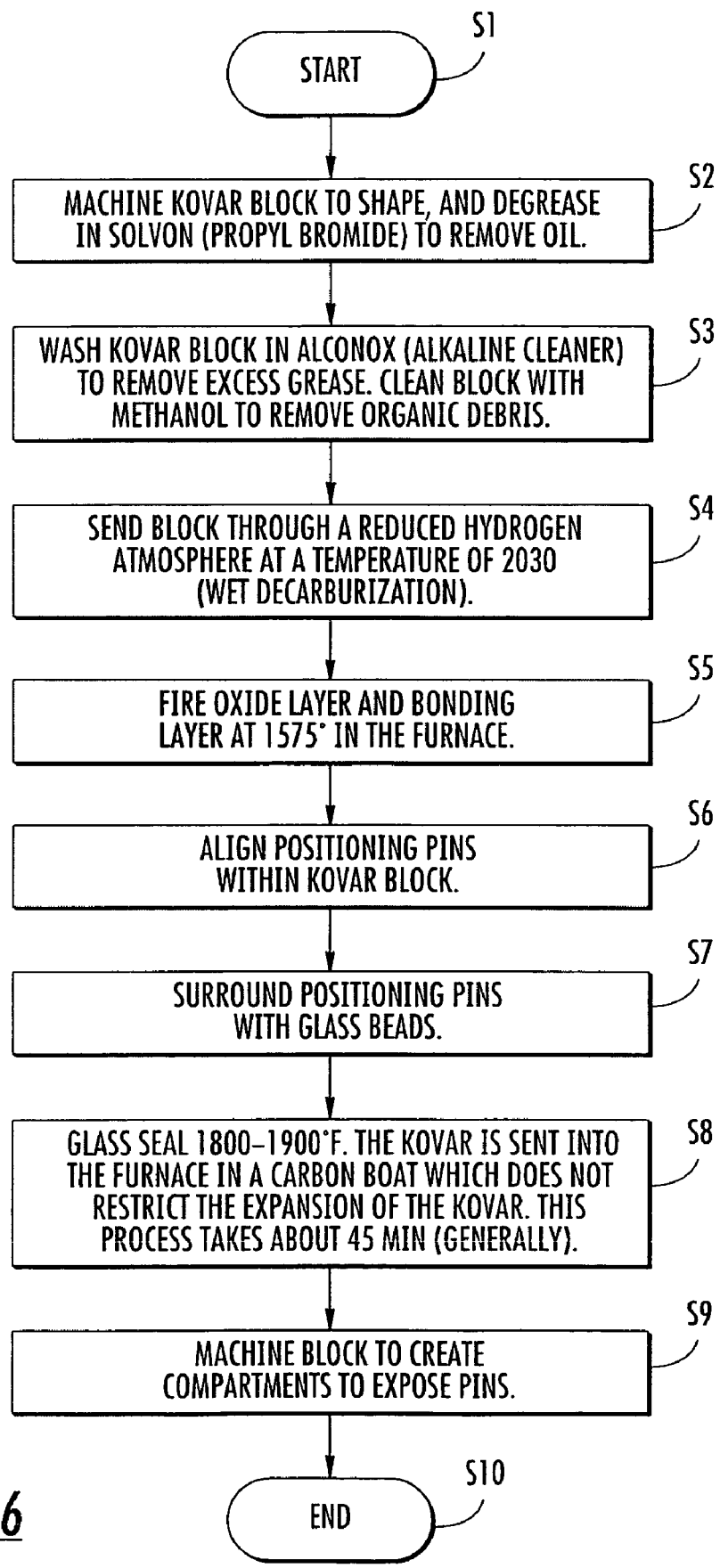
FIG. 16 is a black diagram illustrating the method for forming the package in accordance with the invention.

Referring FIG. 16, the method or process for producing an SMT package 10 in accordance with the invention will now be described. At the beginning of the process (S1) the block of suitable material is selected having dimensions greater then the final dimensions of the final enclosure or housing 12, and being appreciated that the thickness or height of the block of material, as viewed in FIGS. 6 and 7, for example, must be greater than the height shown by at least the dimension of the radius of the cylindrical hole or bore 40 so that a full circular bore may be drilled in the material and, as suggested, a predetermined amount of the material may be removed to leave only the upper half or semi-cylindrical shell as shown in FIGS. 1, 3 and 11.

Initially, the block of material is machined to shape the block to the general size desired. The specific material used is not critical for purposes of the present invention, and any suitable material that can be machined that resists corrosion and has a coefficient of thermal expansion similar to the glass or other hermetic sealing materials used, as well known in the art. Metallic cases or substrates made of various alloys, such as Cu—Mo, Kovar, CuW and others may be used. In the presently preferred embodiment Kovar is the material that has been used and appears to provide satisfactory results. The Kovar block is preferably degreased in Solvon (Propel bromide) to remove any oils or other contaminants on the surface of the Kovar block at S2. At such time, the cylindrical holes or bores 40 are formed within the block. This may, as a result of the drilling step, in part various chemicals or oils to the surface of the block especially in the regions of the holes or bores. At S3, the Kovar block is washed in Alconox (Alkaline cleaner) to remove excess grease. The block is then preferably also cleaned with methanol to remove organic debris.

At S4, the block is sent through a reduced hydrogen atmosphere at a temperature of 2030° to produce wet decarburization, at S4 and, at S5, a fire oxide layer and bonding layer is formed in a furnace at 1575°. At S6, the pins or conductor strips are aligned within the holes or bores 40 within the Kovar block. This may be done with the aide of a suitable jigs or fixtures. At S7, the aligned pins or conductor strips 44 are surrounded with glass beads. The glass beads are then heated to 1800-1900° F. to melt the glass beads and form a glass hermetic seal. The Kovar block is sent into the furnace in a carbon boat which does not restrict the expansion of the Kovar. This process takes generally forty-five (45) minutes with Kovar. The reason that Kovar is a presently preferred material is because its thermal expansion coefficients closely match the thermal coefficients of the glass so that the two materials expand substantially in the similar way and the glass is, therefore, not cracked and an optimum hermetic seal is formed.

After the block has been cooled and the pins hermetically aligned within the holes or bores 40, the block is machined to remove a lower layer of the block, as viewed in FIG. 7, to produce the lower edge 44a' (FIG. 7). The upper end of the block may now be machined to create the RF and DC chambers 26, 28, respectively, the chambers being machined sufficiently deeply to expose the upper edges or surfaces 44b' so that these may be used for connection with the various RF and DC lead as described in connection with FIG. 11. The following connection of the RF and DC leads within the internal compartments, the covered 24 may be placed on the machine block and attached in any conventional way to provide a seal as aforementioned. This process produces a surface mount hermetically sealed package that can be used in any one of a number of different applications and in different environments.

Figure 14:
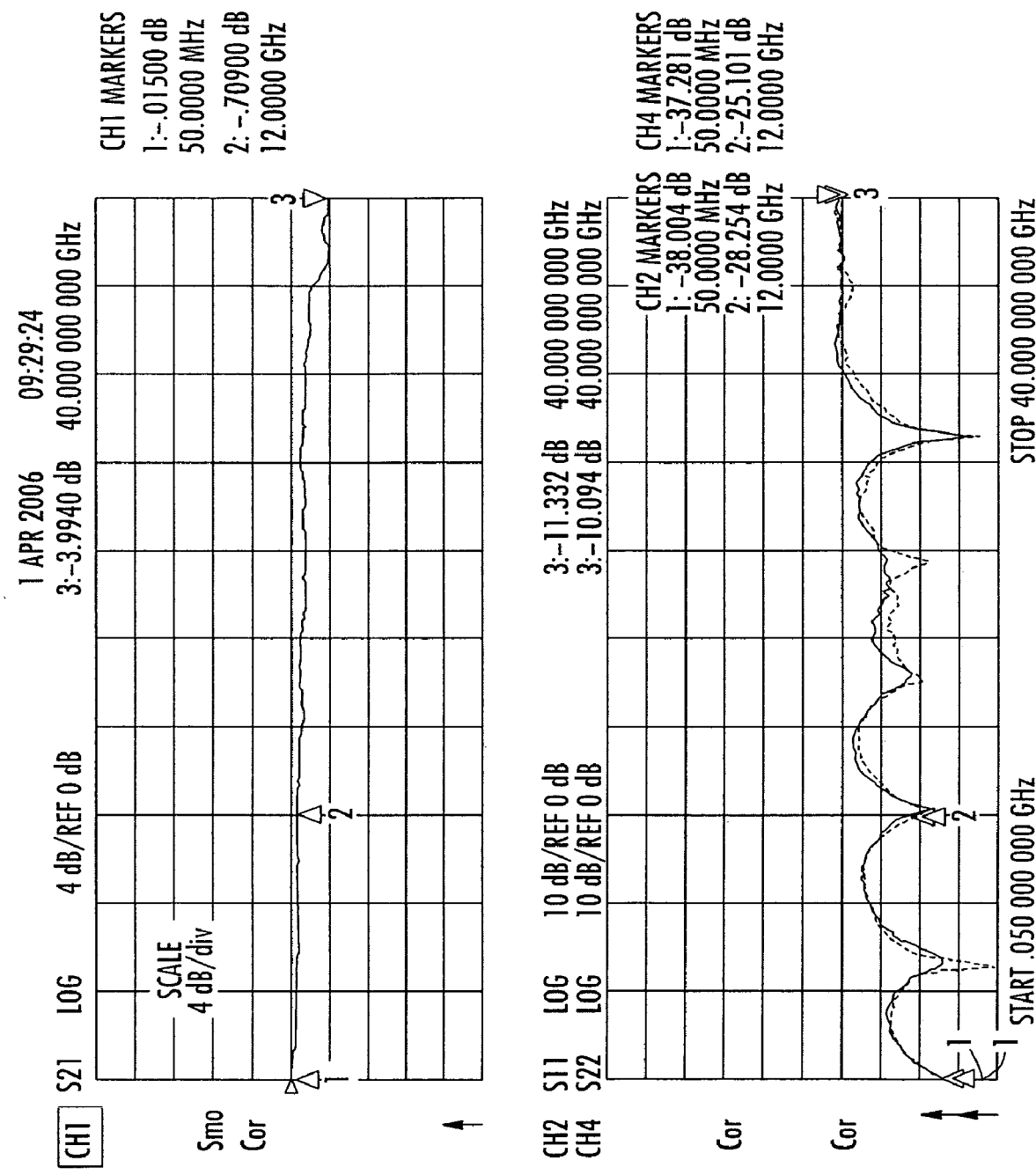
FIGS. 14 and 15 illustrate the gain and return loss over the range of 0.5-50 GHz.
Figure 15:
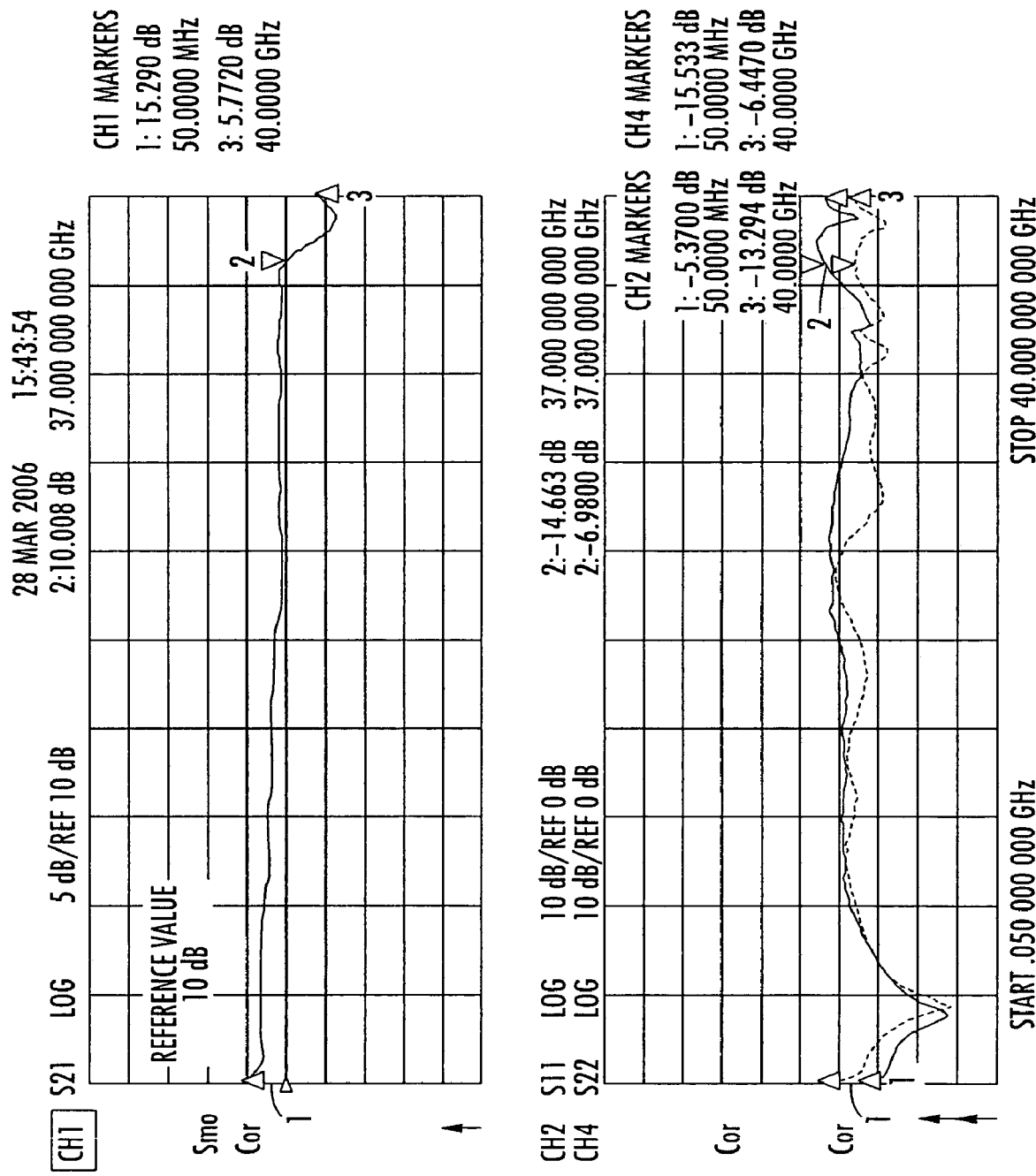

Referring to FIGS. 14 and 15, these illustrate the RF properties or characteristics of the SMT package 10. In FIG. 14 the return loss or input reflection coefficient is shown over a frequency range of 0.5 GHz through 50.0 GHz with a 50 OHM line in the test fixture. Also shown is the gain or forward transmission coefficient over that same frequency range. In FIG. 15 similar characteristics are shown with a medium power wideband low noise amplifier TGA 4830-EPU MMIC within the SMT package 10 when mounted in the test fixture. As will be noted, the gain is substantially as shown in FIG. 14, while the return loss characteristics have actually flattened at least a major portion of the frequency range.

It will be appreciated, therefore, that the SMT package 10 in accordance with the present invention is a true Broadband frequency surface mount hermetically sealed package that can be readily adapted for use up to and beyond 50 GHz with in/out VSWR typically equal to 2.5. The package is hermetically sealed and reliable under varied conditions and can be used in numerous high frequency applications.

While the invention has been shown and described in connection with a preferred form of an embodiment it will be understood that modifications may be made without the departure from the scope or spirit of the invention. Thus, while the cylindrical holes are drilled circular holes, or sectors thereof, it should be clear that other configurations may be used, such as square, oval, etc., as long as the sizes and configurations of the conductive elements or "pins" are accordingly modified to maintain impedance matching and to minimize RF losses.

The invention claimed is:

1. A broadband surface mounting package, comprising:
a housing having a substantially flat bottom wall defining a predetermined perimeter and forming substantially parallel first and second surfaces, and wall means substantially normal to said bottom wall and extending from said bottom wall about said predetermined perimeter to form an enclosure having an top opening opposite said bottom wall to provide access to an interior compartment or cavity dimensioned to receive at least one microwave component, said second surface being arranged to physically and electrically contact a printed circuit board (PCB) for selective attachment to a plurality of conductive lands or pads on the PCB,
at least one cylindrical hole in said enclosure that defines an axis substantially parallel to said bottom wall and has a dimension in a direction generally transverse to said bottom wall to extend from said second surface to at least said first surface, and has an axial length generally parallel to said bottom wall sufficient to provide a through hole in said wall means and a gap within said bottom wall proximate to and inwardly from said wall means;
a J-shaped conductive element having a first portion within said at least one cylindrical hole and extending along a direction parallel to said axis and having a contact surface substantially coextensive with said second surface, and a second portion that projects at least to said first surface and having a connection surface exposed within said cavity to which an electrical connection can be made,
sealing means for hermetically sealing the space between a cylindrical wall forming said at least one cylindrical hole and an associated J-shaped conductive element received therein;
power conductor means for hermetically introducing power into said compartment and to electrical component(s) positioned therein;
connecting means for connecting said power conductor means to internal microwave component(s) and for connecting a microwave signal interface on microwave component(s) to said connecting surface of said J-shaped conductive element; and
a cover for selectively closing and hermetically sealing said top opening of said enclosure after the microwave component(s) has been secured within said compartment and connections by said connecting means have been made, said J-shaped conductive element being configured to promote impedance matching and to reduce microwave signal losses when said enclosure is surface mounted on a PCB to result in electrical contact between a conductive land or pad on the PCB and said connection surface on said J-shaped conductive element and microwave signals are introduced to the internally-mounted microwave component(s) through said at least one hermetically sealed hole in said enclosure.

2. A broadband SMT package as defined in claim 1, wherein said wall means and bottom wall are integrally formed.

3. A broadband SMT package as defined in claim 1, wherein said housing is machined from a block of "Kovar".

4. A broadband SMT package as defined in claim 1, wherein two cylindrical holes are provided each with an associated J-shaped conductive element, one for introducing a microwave signal from the PCB to an input port of a microwave component and another for delivering a microwave signal from an output port of a microwave component to the PCB.

5. A broadband SMT package as defined in claim 1, wherein one of said cylindrical holes is provided for passage of said power conductor means and introducing power from the PCB to a microwave component within the enclosure.

6. A broadband SMT package as defined in claim 1, wherein said cylindrical hole has a substantially uniform cross-section including an arc of a circle.

7. A broadband SMT package as defined in claim 6, wherein said cross-section is generally semi-circular.

8. A broadband SMT package as defined in claim 1, wherein said first and second portions of said J-shaped conductive element are generally normal to each other.

9. A broadband SMT package as defined in claim 8, wherein an inclined edge is provided at a transition point where said first and second portions meet and extends from said second surface.

10. A method of forming a broadband surface mounting package, comprising the steps of:

forming a block of material defining a predetermined plane cutting through said block;

forming at least one cylindrical hole within said block that defines an axis generally parallel to said predetermined plane and has a predetermined axial length;

positioning a J-shaped conductive element within said at least one cylindrical hole and extending along a direction parallel to said axis and having a first portion having a contact surface below said predetermined plane substantially coextensive with said second surface, and a second portion that projects at least to said predetermined plane and having a connection surface to which an electrical connection can be made within said compartment, hermetically sealing the space between a cylindrical wall forming said at least one cylindrical hole and an associated J-shaped conductive element received therein to fix the position of said J-shaped conductive element within said at least one cylindrical hole while providing a hermetic seal;

machining an interior region of said block to one side of said predetermined plane to form a cavity or compartment surrounded by a peripheral wall having a thickness less than said predetermined axial length where said at least one cylindrical hole is formed and a first surface substantially coextensive with said predetermined plane to expose said connection surface of said J-shaped conductive element within said cavity or compartment and forming an open top opposite said first surface to provide access to said cavity or compartment dimensioned to receive at least one microwave component on said first surface;

machining said block to another side of said predetermined plane to form a second surface coextensive with said contact surface of said J-shaped conductive element, said first and second surfaces together forming a bottom wall of an enclosure, said second surface being substantially flat and suitable for placement on a printed circuit board (PCB) to provide physical and electrical contact of said contact surface with an electrical pad or land on the PCB;

establishing hermetic means for introducing power from the outside to the inside of the enclosure; and providing a cover for selectively closing and hermetically sealing said top opening of said enclosure after microwave component(s) has been secured within said compartment and connections by said connecting means have been made, said J-shaped conductive element being configured to promote impedance matching and to reduce microwave signal losses when said enclosure is surface mounted on a PCB to result in electrical contact between a conductive land or pad on the PCB and said connection surface on said J-shaped conductive element and microwave signals are introduced to the internally-mounted microwave component(s) through said at least one hermetically sealed hole in said enclosure, whereby at least one microwave component can be placed within said cavity or compartment of said enclosure and cover can be placed over the open top to hermetically seal said enclosure after connecting a power to internal microwave component(s) and connecting a microwave signal interface(s) on microwave component(s) to said contact surface of said J-shaped conductive element and the enclosure surface-mounted on a PCB.

11. A method as defined in claim 10, wherein a plurality of cylindrical holes are formed one for each microwave signal flowing between the PCB and microwave component(s) within the enclosure.

12. A method as defined in claim 10, wherein a hermetically-sealed cylindrical hole is formed for hermetically introducing power from the PCB to the microwave component within the enclosure.

13. A method as defined in claim 10, wherein the block of material is made formed of "Kovar".

14. A method as defined in claim 13, further comprising the step of degreasing the block after machining to form the block of material and prior to said hermetic sealing steps.

15. A method as defined in claim 14, wherein Propyl Bromide is used in the degreasing step.

16. A method as defined in claim 14, further comprising the step of washing the machined block after said degreasing step.

17. A method as defined in claim 16, wherein an alkaline cleaner is used for said washing step.

18. A method as defined in claim 16, further comprising the step of cleaning said block with Methanol to remove organic debris.

19. A method as defined in claim 16, further comprising the step of firing oxide and bonding layers to said block at approximately 1575° F. in a furnace.

20. A method as defined in claim 10, wherein said machining steps to form said cavity or compartment and to form said second surface are performed after all hermetic seals have been formed within said at least one cylindrical hole.

* * * * *